US006960877B1

(12) United States Patent
Heeks et al.

(10) Patent No.: US 6,960,877 B1
(45) Date of Patent: Nov. 1, 2005

(54) ORGANIC LIGHT-EMITTING DEVICES INCLUDING SPECIFIC BARRIER LAYERS

(75) Inventors: Stephen Karl Heeks, Cottenham (GB); Jeremy Henley Burroughes, Cambridge (GB); Julian Charles Carter, Dry Drayton (GB); Peter Devine, Milton (GB)

(73) Assignee: Cambrdige Display Technology Limited, Cambridge (GB)

( * ) Notice: Subject to any disclaimer, the term of this patent is extended or adjusted under 35 U.S.C. 154(b) by 0 days.

(21) Appl. No.: 09/868,262

(22) PCT Filed: Dec. 14, 1999

(86) PCT No.: PCT/GB99/04144

§ 371 (c)(1), (2), (4) Date: Jan. 3, 2002

(87) PCT Pub. No.: WO00/36661

PCT Pub. Date: Jun. 22, 2000

(30) Foreign Application Priority Data

Dec. 17, 1998 (GB) .................................... 9827827
Sep. 24, 1999 (GB) .................................... 9922723

(51) Int. Cl.[7] ................................................ H05B 33/04

(52) U.S. Cl. ....................................... 313/512; 313/509

(58) Field of Search ................................ 313/504, 505, 313/509–512, 506; 428/690, 917; 445/24; 257/40; 315/169.3

(56) References Cited

U.S. PATENT DOCUMENTS 5,429,884 A * 7/1995 Namiki et al. .............. 428/690
5,652,067 A * 7/1997 Ito et al. ...................... 428/690
5,686,360 A * 11/1997 Harvey et al. ................ 438/28
5,739,635 A * 4/1998 Wakimoto .................. 313/504
5,747,930 A * 5/1998 Utsugi ......................... 313/504
5,776,622 A * 7/1998 Hung et al. ................. 428/690
5,811,177 A * 9/1998 Shi et al. ..................... 428/209
5,920,080 A * 7/1999 Jones .......................... 257/40

(Continued)

FOREIGN PATENT DOCUMENTS

EP 0740489 A1 10/1996
EP 0741419 A2 11/1996

(Continued)

OTHER PUBLICATIONS

English translation of office action from the Japanese Patent Office dated Dec. 2, 2003.

*Primary Examiner*—Karabi Guharay
(74) *Attorney, Agent, or Firm*—Kudirka & Jobse, LLP

(57) ABSTRACT

An organic light-emitting device comprising a layer of light-emissive organic material interposed between a first electrode and a second electrode, at least one of the first and second electrodes comprising one or more electrode layers on the layer of light-emissive organic material for injecting charge carriers into the light-emissive organic material, wherein the organic light-emitting device further comprises a layer of dielectric material on the surface of the outermost electrode layer remote from the layer of light-emissive organic material.

7 Claims, 3 Drawing Sheets

U.S. PATENT DOCUMENTS

| | | | | |
|---|---|---|---|---|
| 6,198,220 | B1 * | 3/2001 | Jones et al. | 313/512 |
| 6,284,342 | B1 * | 9/2001 | Ebisawa et al. | 428/69 |
| 6,402,579 | B1 * | 6/2002 | Pichler et al. | 445/24 |
| 6,614,175 | B2 * | 9/2003 | Aziz et al. | 313/504 |
| 6,740,429 | B2 * | 5/2004 | Aziz et al. | 428/690 |
| 6,765,348 | B2 * | 7/2004 | Aziz et al. | 313/504 |

FOREIGN PATENT DOCUMENTS

| | | |
|---|---|---|
| EP | 0777280 A2 | 6/1997 |
| JP | 4-73886 | 3/1992 |
| JP | 5-315078 | 11/1993 |
| JP | 07169567 A | 7/1995 |
| JP | 9-148066 | 6/1997 |
| JP | 9-272863 | 10/1997 |
| JP | 10-223377 | 8/1998 |
| JP | 11-260546 | 9/1999 |
| WO | WO 97/16053 | 5/1997 |
| WO | WO 98/10473 | 3/1998 |
| WO | WO 98/59528 | 12/1998 |
| WO | WO 99/02277 | 1/1999 |

* cited by examiner

ORGANIC LIGHT-EMITTING DEVICES INCLUDING SPECIFIC BARRIER LAYERS

This invention relates to organic light-emitting devices (OLEDs).

FIELD OF THE INVENTION

Organic light-emitting devices such as described in U.S. Pat. No. 5,247,190 or in U.S. Pat. No. 4,539,507, the contents of which are incorporated herein by reference, have great potential for use in various display applications. According to one method, an OLED is fabricated by coating a glass or plastic substrate with a transparent first electrode (anode) such as indium tin oxide (ITO). At least one layer of a thin film of an electroluminescent organic material is then deposited prior to a final layer which is a film of a second electrode (cathode) which is typically a metal or alloy.

BACKGROUND OF THE INVENTION

From the point of view of electron-injecting properties, a layer of a metal having a low work function such as calcium or an alloy containing a metal having a low work function are the preferred materials for the cathode. However, it is an intrinsic property of such low work function elements that they are very prone to reactions with reactive ambient species such as oxygen or moisture. Such reactions detrimentally affect the electron-injecting properties of the cathode causing the formation of non-emitting black spots with a consequent degradation in device performance.

SUMMARY OF THE INVENTION

It is therefore an aim of the present invention to provide an organic light-emitting device which is less prone to the formation of non-emitting black spots and therefore displays improved resistance to performance degradation.

It is another aim of the present invention to provide a method of producing a protective cap for an electrode of an organic light-emissive device which minimizes damage to the underlying organic layers.

According to one aspect of the present invention, there is provided an organic light-emitting device comprising at least one layer of a light-emissive organic material interposed between a first electrode and a second electrode, at least one of the first and second electrodes comprising one or more electrode layers on the light-emissive material; wherein the organic light-emitting device further has a stack comprising an inert barrier layer and at least one gettering layer interposed between the outermost electrode layer and the inert barrier layer for absorbing moisture and oxygen.

The advantages of this aspect of the present invention are particularly pronounced when the electrode upon which the stack is formed comprises at least one layer deposited by vacuum evaporation.

The inert barrier layer serves to minimize the entry of reactive species into the device, and the gettering layer serves to absorb any traces of reactive species which manage to somehow permeate through the inert barrier layer.

The inert barrier layer is preferably a layer of an inorganic dielectric material preferably selected from the group consisting of AlN, $Al_2O_3$, $SiO_2$ and $Si_3N_4$, and preferably has a thickness in the range of 0.01 to 10 microns, further preferably in the range of 1 to 10 microns. The inert barrier layer is preferably deposited by a sputtering technique to provide a pinhole-free layer.

The gettering layer is preferably a layer of a material which displays high reactivity towards moisture and oxygen such as Li, Ca, Ba or Cs, or an alloy of the same such as LiAl, or a hygroscopic oxide such as BaO. It preferably has a thickness in the range of 0.01 to 5 microns. Calcium is a particularly preferred material for the gettering layer. The gettering layer may be deposited by a sputtering technique to provide a pinhole-free layer. Alternatively, it may be deposited by a vacuum evaporation technique.

According to another aspect of the present invention, there is provided an organic light-emitting device comprising a layer of light-emissive organic material interposed between a first electrode and a second electrode, at least one of the first and second electrodes comprising one or more electrode layers on the layer of light-emissive organic material for injecting charge carriers into the light-emissive organic material, wherein the organic light-emitting device further comprises a layer of dielectric material on the surface of the outermost electrode layer remote from the layer of light-emissive organic material.

The advantages of this aspect of the present invention are also particularly pronounced when the electrode upon which the dielectric layer or layers is formed comprises at least one layer deposited by vacuum evaporation.

In one embodiment of the present invention, the organic light-emitting device further comprises a second layer of dielectric material on the first layer of dielectric material, the thickness of the dielectric layers being selected so as to reduce mechanical stress on the electrode.

Suitable dielectric materials for each of the first and second layers include inorganic dielectric materials, preferably SiO, AlN, $SiO_2$, $Si_3N_4$ and $Al_2O_3$. The thickness of each of the dielectric layers is preferably in the range of 0.01 to 10 microns, preferably in the range of 1 to 10 microns.

Each of the dielectric layers may be deposited by a sputtering technique or by a vacuum evaporation technique.

According to a third aspect of the present invention, there is provided a method of providing a protective cap on a first electrode of an organic light-emitting device comprising at least one layer of a light-emissive organic material between first and second electrodes for injecting charge carriers into the light-emissive organic material, said method comprising the step of forming a first layer of a dielectric material on the surface of the first electrode opposite the layer of light-emissive organic material by a vacuum evaporation technique.

The first electrode typically comprises one or more metal layers with the dielectric layer being formed directly on the surface of the outermost metal layer remote from the organic light-emissive material.

Further barrier layers and/or gettering layers of the kind discussed above can be provided on the first dielectric layer.

As with the first and second aspects of the present invention, the advantages of the third aspect of the present invention are pronounced when the subject electrode has been deposited by a vacuum evaporation technique.

BRIEF DESCRIPTION OF THE DRAWINGS

Hereunder, preferred embodiments of the present invention will be described, by way of example only, with reference to the accompanying drawings in which:—

DETAILED DESCRIPTION

Figure 1:
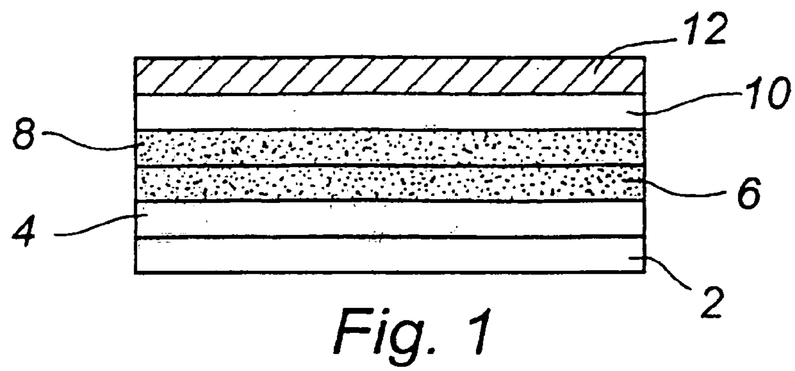
FIG. 1 is a schematic cross-sectional view of an organic light-emitting device according to a first embodiment of the present invention.

An organic light-emitting device according to a first embodiment of the present invention is shown in FIG. 1. The device comprises a first electrode layer 4, in this case an anode layer comprised of indium tin oxide (ITO) formed on a substrate 2. The substrate may, for example, be one made of glass or a flexible plastic substrate or may be a glass-plastic laminate. A first thin film 6 of a light-emissive organic material (in this case, poly(phenylenevinylene) (PPV)) is formed on the ITO layer 4. This organic PPV layer can be formed by spin-coating a precursor to PPV in a suitable solvent onto the ITO layer and then heating the spin-coated layer to convert the precursor to the polymer PPV. A second thin film 8 of an organic material (such as MEH-PPV) is formed on the first thin film of light-emissive organic material 6. This second thin film 8 can, for example, be formed in the same general manner as the first thin film 6 of light-emissive organic material. The second thin film of organic material may serve as a light-emissive layer or a charge transport layer or have some other purpose. Further light-emissive organic layers can be provided.

Alternatively, layer 6 could be a charge-transport layer such as polyethylenedioxythiophene doped with polystyrene sulphonic acid (PEDT:PSS), or polyaniline and the second thin film 8 may be the light-emissive layer such as a blend of 5% poly(2,7-(9,9-di-n-octylfluorene)-3,6-(benzothiadiazole) with 95% poly(2,7-(9,9-di-n-octylfluorene) (5F8BT), poly (2,7-(9,9-di-n-octylfluorene) (F8), poly(2,7-(9,9-di-n-octylfluorene)-(1,4-phenylene-((4-methylphenyl)imino)-1,4-phenylene-((4-methylphenyl)imino)-1,4-phenylene))/poly(2,7-(9,9-di-n-octylfluorene) (PFM:F8), poly(2,7-(9,9-di-n-octylfluorene)-(1,4-phenylene-((4-methoxyphenyl)imino)-1,4-phenylene-((4-methoxyphenyl)imino)-1,4-phenylene))/poly(2,7-(9,9-di-n-octylfluorene)/poly(2,7-(9,9-di-n-octylfluorene) -(1,4-phenylene-((1,4-phenylene-((4-secbutylphenyl)imino)-1,4-phenylene)) (PFMO:F8:TFB).

A thin layer 10 of calcium having a thickness of 200 nm is formed on the second thin film of organic material 8. This calcium layer functions as a cathode and can be formed, for example, by rf sputtering or dc magnetron sputtering (preferably using neon as a discharge gas) or by vacuum evaporation. Vacuum evaporation is the preferred technique because it causes less damage to the underlying organic material than a sputtering technique.

A thick layer of aluminium nitride 12 having a thickness of about 10 microns is formed on the thin layer of calcium 10. This aluminium nitride layer is preferably deposited by sputtering to provide a pinhole-free layer. A conventional sputtering technique such as rf sputtering or dc magnetron sputtering may be employed using a sputter target/cathode made of aluminium and a discharge gas containing nitrogen.

This thick aluminium nitride layer 12 is very impermeable with respect to ambient species such as oxygen and moisture and therefore serves to effectively protect the underlying calcium cathode layer from these reactive species.

Figure 2:
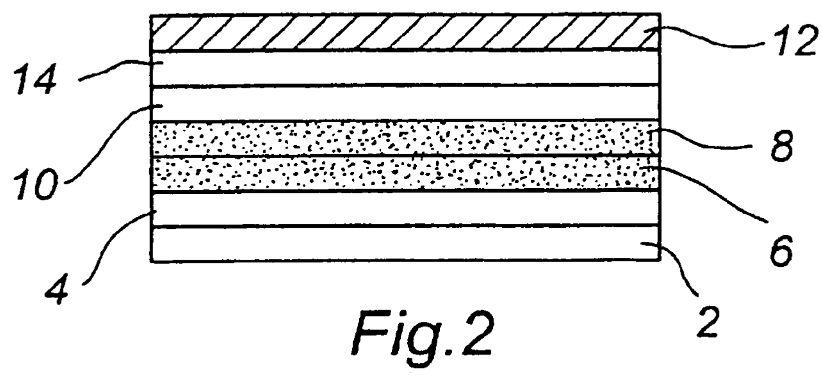
FIG. 2 is a schematic cross-sectional view of an organic light-emitting device according to a second embodiment of the present invention.

An organic light-emitting device according to a second embodiment of the present invention is shown in FIG. 2. It is identical to the device shown in FIG. 1 except that an additional layer 14 of aluminium having a thickness of 5 microns is provided between the thin calcium layer 10 and the thick layer of aluminium nitride 12 as a second cathode layer. In this case, this intermediate layer of aluminium is formed by vacuum evaporation, but it could alternatively be formed by a sputtering technique for example.

Figure 3:
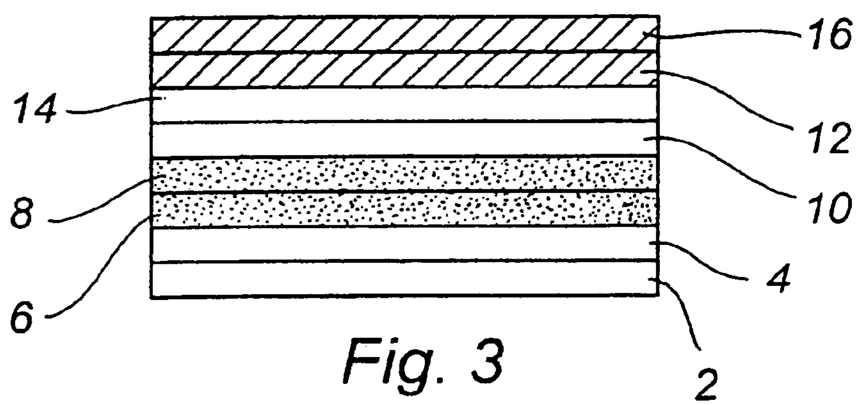
FIG. 3 is a schematic cross-sectional view of an organic light-emitting device according to a third embodiment of the present invention.

An organic light-emitting device according to a third embodiment of the present invention is shown in FIG. 3. It is similar to the device shown in FIG. 2 except that a thick layer 16 of aluminium oxide having a thickness of about 10 microns is provided on the thick layer of aluminium nitride 12. This top layer of aluminium oxide is preferably formed by a sputtering technique in order to provide a pinhole-free layer.

Figure 4:
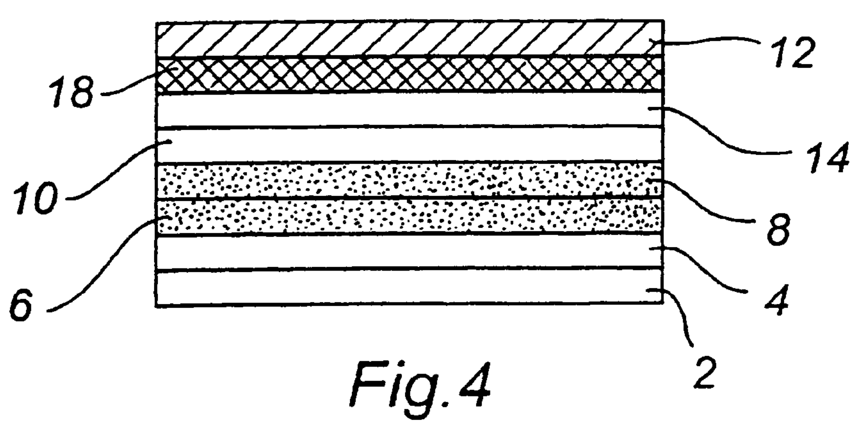
FIG. 4 is a schematic cross-sectional view of an organic light-emitting device according to a fourth embodiment of the present invention.

An organic light-emitting device according to a fourth embodiment of the present invention is shown in FIG. 4. This device is identical to that shown in FIG. 2 except that a second layer of calcium 18 having a thickness of about 5 microns is provided between the aluminium layer 14 and the aluminium nitride layer 12. This second calcium layer is provided to getter any reactive species which may somehow manage to permeate through the overlying aluminium nitride and thus provide protection for the underlying cathode. This second layer of calcium 18 is preferably deposited by a sputtering technique in order to provide a pinhole-free layer.

Figure 5:
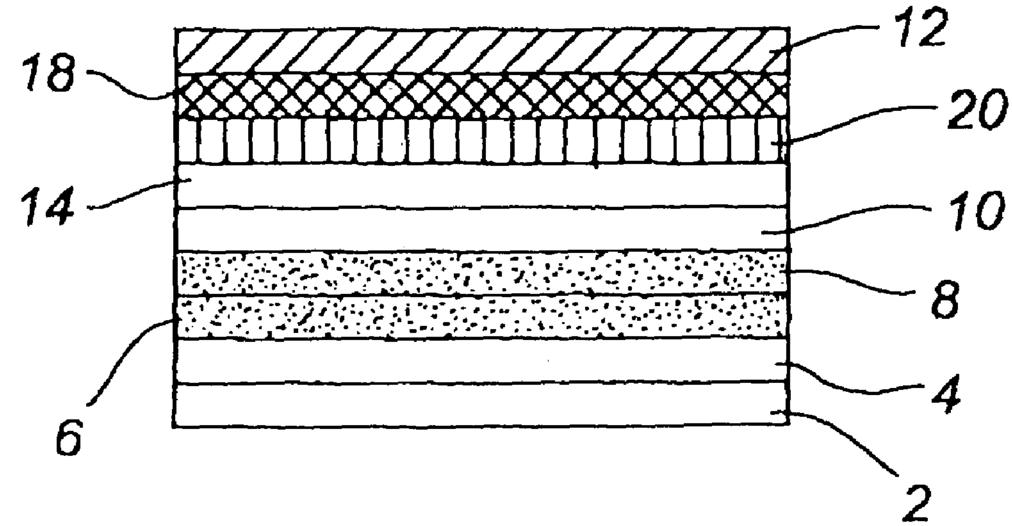
FIG. 5 is a schematic cross-sectional view of an organic light-emitting device according to a fifth embodiment of the present invention.
Figure 6:
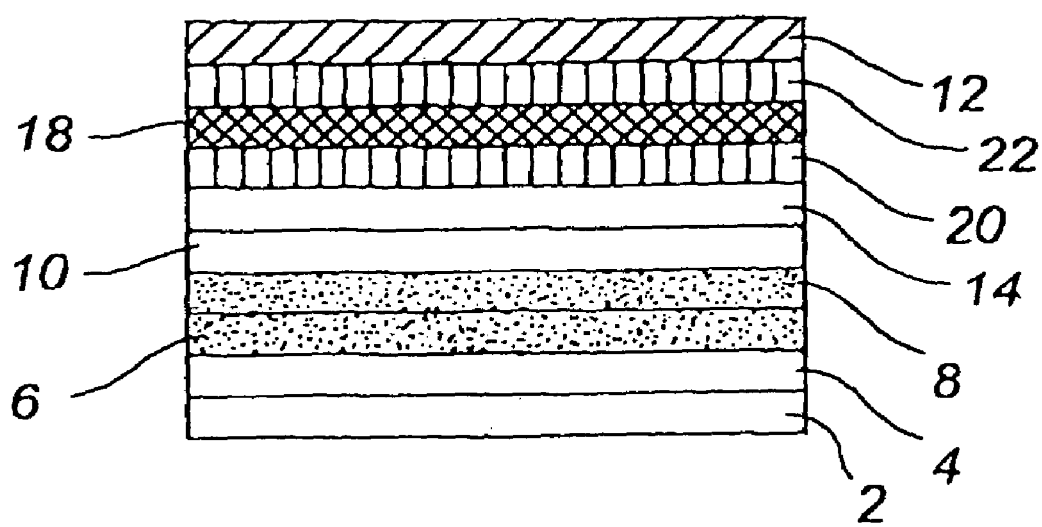
FIG. 6 is a schematic cross-sectional view of an organic light-emitting device according to a sixth embodiment of the present invention.

An organic light-emitting device according to a fifth embodiment of the present invention is shown in FIG. 5. This device is similar to that shown in FIG. 4 except that a sputtered layer of aluminium 20 having a thickness of about 10 microns is provided between the evaporated aluminium layer 14 and the second layer of calcium 18 as an additional barrier layer. According to a further variation as shown in FIG. 6, a further sputtered layer of aluminium 22 is provided between the second calcium layer 18 and the aluminium nitride layer 12.

Figure 7:
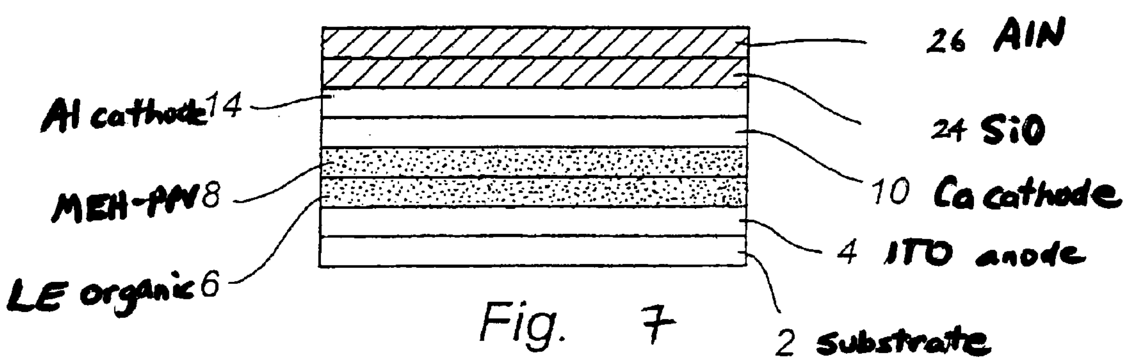
FIG. 7 is a schematic cross-sectional view of an organic light-emitting device according to a seventh embodiment of the present invention.

An organic light-emissive device according to a seventh embodiment of the present invention is shown in FIG. 7. This is similar to the device shown in FIG. 3, except that the Ca/Al two-layer cathode is capped with a 1000 Angstrom layer 24 of SiO deposited by thermal evaporation from a high temperature ceramic boat and a 10 micron layer 26 of aluminium nitride deposited by sputtering. The protective SiO/AlN two-layer cap employed in this embodiment provides excellent cathode protection. It is thought that this is due to the fact that the SiO layer not only acts as a physical barrier but also acts as a gettering layer by reacting with moisture.

Although, the devices described above all demonstrate the application of the present invention to the protection of a cathode, the present invention can equally be applied to the protection of the anode, or both the anode and the cathode.

What is claimed is:

1. An organic light-emitting device comprising at least one layer of a light-emissive organic material interposed between a first electrode and a second electrode, all formed on a substrate, wherein at least one of the first and second electrodes is formed on a side of the light-emissive organic material remote from the substrate, the at least one electrode comprising one or more electrode layers on the light-emissive material for injecting charge carriers into the light-emissive material, and wherein a stack is formed on the at least one electrode on the side of the light-emissive organic material remote from the substrate the stack comprising a first inert barrier layer and a SiO layer interposed between an outermost layer of the one or more electrode layers and the first inert barrier layer for absorbing moisture and oxygen, and wherein the first inert barrier layer is a layer of material selected from the group consisting of AlN, $Al_2O_3$, $SiO_2$, and $Si_3N_4$.

2. An organic light-emitting device according to claim 1 wherein the first inert barrier layer has a thickness in the range of 0.01 to 10 microns.

3. An organic light-emitting device according to claim 1 wherein the thickness of the SiO layer is in the range of 0.01 to 5 microns.

4. An organic light-emitting device according to claim 1 wherein at least one of the first and second electrodes is a multi-layered electrode comprising a first low work function conductive layer on the layer of light-emissive organic material and a second conductive layer on the surface of the first low work function conductive layer remote from the layer of light-emissive organic material.

5. An organic light-emitting device according to claim 4 wherein the first low work function conductive layer is an evaporated layer of calcium having a thickness of 200 nm or less, and the second conductive layer is a layer of evaporated aluminium having a thickness of 5 microns or less.

6. An organic light-emitting device according to claim 1 wherein the first inert barrier layer is a layer of AlN.

7. An organic light-emitting device according to claim 1 wherein the SiO layer is directly adjacent a surface of the outermost electrode layer.

* * * * *

UNITED STATES PATENT AND TRADEMARK OFFICE

CERTIFICATE OF CORRECTION

PATENT NO. : 6,960,877 B1
DATED : November 1, 2005
INVENTOR(S) : Heeks et al.

It is certified that error appears in the above-identified patent and that said Letters Patent is hereby corrected as shown below:

Column 5,
Line 8, after "substrate" insert -- , --.

Signed and Sealed this

Seventeenth Day of January, 2006

JON W. DUDAS
*Director of the United States Patent and Trademark Office*